(12) United States Patent
Nagasaku et al.

(10) Patent No.: US 6,897,735 B2
(45) Date of Patent: May 24, 2005

(54) OSCILLATOR, TRANSMITTER/RECEIVER MODULE AND RADAR SYSTEM

(75) Inventors: Toshiyuki Nagasaku, Kokubunji (JP); Naoyuki Kurita, Kokubunji (JP); Hiroshi Kondoh, Fuchu (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/073,292

(22) Filed: Feb. 13, 2002

(65) Prior Publication Data

US 2003/0042988 A1 Mar. 6, 2003

(30) Foreign Application Priority Data

Sep. 6, 2001 (JP) ........................................ 2001-270433

(51) Int. Cl.[7] .................................................. H03B 5/18
(52) U.S. Cl. .............................. 331/117 D; 331/107 DP
(58) Field of Search ....................... 331/107 SL, 117 D, 331/107 DP, 177 V, 117 FE, 96, 99, 158

(56) References Cited

U.S. PATENT DOCUMENTS

| | | | | |
|---|---|---|---|---|
| 4,187,476 A | * | 2/1980 | Shinkawa et al. | 331/117 D |
| 4,360,909 A | * | 11/1982 | Tajima | 369/170 |
| 4,731,611 A | | 3/1988 | Miller et al. | 342/28 |
| 4,871,983 A | * | 10/1989 | Graycar | 331/96 |
| 5,576,667 A | * | 11/1996 | Goma | 331/117 D |
| 5,701,104 A | | 12/1997 | Heide | 331/96 |
| 6,091,355 A | * | 7/2000 | Cadotte et al. | 342/104 |
| 6,121,917 A | * | 9/2000 | Yamada | 342/128 |
| 6,130,607 A | * | 10/2000 | McClanahan et al. | 340/436 |
| 6,133,795 A | * | 10/2000 | Williams | 331/9 |
| 6,204,739 B1 | * | 3/2001 | Sakamoto et al. | 333/219.1 |
| 6,236,352 B1 | * | 5/2001 | Walmsley | 342/118 |
| 6,239,663 B1 | * | 5/2001 | Mizutani | 331/107 SL |
| 6,344,779 B1 | * | 2/2002 | Haruta et al. | 331/96 |
| 6,369,676 B2 | * | 4/2002 | Sakamoto et al. | 333/219.1 |
| 6,429,806 B1 | * | 8/2002 | Walmsley | 342/127 |

OTHER PUBLICATIONS

Mizan et al, "Phase Noise and Frequency Stability of Ka–Band Harmonic Dielectric Resonator Oscillators, " Frequency Control Symposium, 1993, 47th Proceedings of the 1993 IEEE International Salt Lake City, UT, USA, Jun. 2–4, 1993, New York, NY, USA, IEEE, Jun. 2, 1993, pp. 733–739.

M. Funabashi et al, "A 60GHz MMIC Stabilized Frequency Source Composed of a 30GHz DRO and a Doubler", IEEE MIT–S Digest, 1995, pp. 71–74.

* cited by examiner

*Primary Examiner*—Timothy P. Callahan
*Assistant Examiner*—Cassandra Cox
(74) *Attorney, Agent, or Firm*—Mattingly, Stanger & Malur, P.C.

(57) ABSTRACT

The oscillator includes an active device, a substrate, a microstrip line formed on the substrate, and a dielectric block. The resonator is made up with the microstrip line and the dielectric block that is disposed so as to couple with the microstrip line. The active device produces a negative resistance in a desired oscillation frequency band. The dielectric block is set such that a resonance frequency of the lowest order mode of the dielectric block is lower than a desired oscillation frequency, and the resonance frequency of one of the higher order modes coincides with the desired oscillation frequency. The oscillator is generated with the higher order mode of the resonator. Thus, the invention provides at a low cost a millimeter wave band oscillator of a low phase noise by using this oscillator, and a transmitter-receiver module and a radar system applying this oscillator to the local signal generator.

20 Claims, 8 Drawing Sheets

OSCILLATOR, TRANSMITTER/RECEIVER MODULE AND RADAR SYSTEM

BACKGROUND OF THE INVENTION

The present invention relates to an oscillator with a dielectric resonator and a transmitter/receiver module, which is especially useful for application to the transmitter/receiver module that uses this oscillator as the local signal generator thereof.

Traditionally, a dielectric resonator using a dielectric block with a high dielectric constant has frequently been employed as the resonator for the oscillator that operates in the high-frequency band such as the microwave or the millimeter wave. Such examples can be observed in the IEEE MTT-S 1995 International Microwave Symposium Digest, pp. 71–74, for example.

Figure 5:
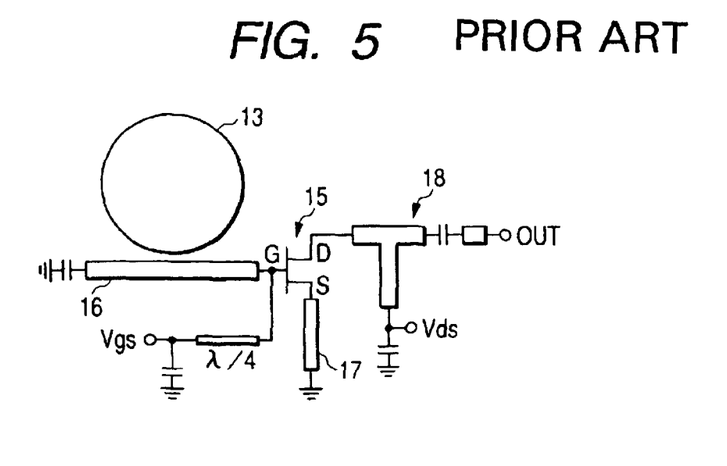
FIG. 5 is a diagram illustrating an example of a conventional oscillator using a dielectric resonator.

FIG. 5 illustrates an example of an oscillator using a dielectric resonator. A dielectric block 13 is placed close to a microstrip line 16 to couple the microstrip line 16 with dielectric block 13, which forms a resonator. As the dielectric block, other than the cylindrical type as illustrated in FIG. 5, a cubic type dielectric block is often used. As to an active device 15 that produces a negative resistance, a bipolar transistor is used other than the FET illustrated in the figure. The parameters of a feedback loop circuit 17 and a matching circuit 18 and the like are determined in such a manner that the active device 15 assumes the negative resistance at a desired oscillation frequency. There are various types of the feedback loop circuit, other than the one illustrated in FIG. 5.

The dimension of the dielectric block 13 is usually determined in such a manner that a resonance frequency of the lowest order mode of the dielectric resonator coincides with a desired oscillation frequency, and the resonance frequencies of the higher order modes other than the lowest order are separated as far as possible from the desired oscillation frequency. In the case of using a cylindrical dielectric block, for example, the lowest order mode is TE01δ mode, and the radius R and the thickness t of the bottom of the dielectric block is determined to meet the relation: 0.2<t/(2R)<0.4, so that the resonance frequencies of the higher order modes are sufficiently separated from the frequency of the lowest order mode.

Now, in order to realize an oscillator with a low phase noise, the Q factor of the resonator thereof should be as high as possible. The Q factor of the dielectric resonator lowers depending on the dielectric loss and the conductor loss, etc. In a super high-frequency band as the millimeter wave, the device characteristics is often insufficient in the operation frequency; and it is necessary to intensify the coupling of the dielectric block with the microstrip line and lighten the load. Here, the dielectric block is needed to sufficiently approach to the microstrip line, and since the conductor lies within point-blank range to the dielectric block, there is a possibility that the conductor loss increases and the Q factor decreases.

Also, as the resonance frequency increases, the dimension of the dielectric block decreases, accordingly the dimension in a super high-frequency band as the millimeter wave becomes extremely small. Therefore, the processing of the dielectric block becomes difficult, which results in an increase in the unit cost of the dielectric block. Further, the handling thereof becomes difficult, which increases the assembling cost of the oscillator.

To avoid such problems, there is used a method of attaining a desired frequency signal by oscillating the resonator at 1/n the frequency such as ½ or ¼ the primarily necessary frequency and multiplying the frequency of the signal by n times by using a multiplier. This method will avert the foregoing problems, because the oscillator oscillates at 1/n the frequency. However, that the operational frequency of the oscillator is 1/n the primarily necessary frequency involves enlargement of the size of the matching circuit and the like, which increases the chip size and requires a new multiplier, thus leading to cost increases due to increase of the number of chips, etc., which is disadvantageous.

As described above, the traditional system is difficult to acquire a sufficiently high Q factor in the dielectric resonator with which an oscillator for a super high-frequency band as the millimeter wave is configured, and the phase noise of the oscillator is not sufficiently suppressed, which are the problems to be solved. Further, the size shrinkage of the dielectric block accompanies difficulty of the processing, which increases the unit cost of the dielectric block. It also involves difficulty of the handling to increase the assembling cost of the oscillator, which are the disadvantages. Further, in the case of using a multiplier, the enlargement of the chip size and the increase of the number of chips result in cost increases.

It is therefore an object of the invention to solve the aforementioned problems, to restrain cost increases, and to achieve an oscillator of a low phase noise.

Another object of the invention is to solve the aforementioned problems and to configure a low cost/high performance transmitter/receiver module, by using an oscillator of a low phase noise achieved while lowering cost increases as a local signal generator for a transmitter/receiver unit.

Another object of the invention is to solve the aforementioned problems and to realize at a low cost a high performance radar system that restricts deterioration of radar performance due to phase noise, by using an oscillator of low phase noise achieved while lowering cost increases as a local signal generator for a radar system.

SUMMARY OF THE INVENTION

In view of the aforementioned problems, according to one aspect of the invention, the dimension of the dielectric block and so forth are set in such a manner that the resonance frequency of the lowest order mode of a dielectric resonator is lower than a desired oscillation frequency, and the resonance frequency of one of the higher order modes is coincident with the desired oscillation frequency. Now, there are the resonance frequencies of the lowest order mode and the unused higher order modes, except for the resonance frequency of the used order mode. Therefore, the negative resistance is sufficiently lowered at the resonance frequencies of the unused order modes so as not to generate unintentional spurious oscillations at these frequencies, so that the active device can produce the negative resistance only within a narrow band close to the desired oscillation frequency. To achieve this small negative resistance, a measure is used which adjusts the parameters of a feedback loop circuit and a matching circuit, or inserts a filter circuit between the active device and the resonator or the like. It is also necessary to prevent the spurious oscillations at the resonance frequencies of the lowest order mode and the unused higher order modes, by adjusting the phase to make a phase condition under which an oscillation is not created.

As mentioned above, it is possible to expand the dimension of the dielectric block in comparison to the conventional example that uses the resonance frequency of the lowest order mode, by applying the resonance frequency of the higher order mode of the resonator to the oscillation frequency of the system. Accordingly, when the dielectric block is disposed very close to the microstrip line, it becomes possible to increase the ratio of the volume of the dielectric block to the area of the line conductor located adjacently to the dielectric block, and to reduce the conductor loss in comparison to the example that uses the lowest order mode. Therefore, the Q factor of the resonator can be raised, whereby the oscillator of a low phase noise can be configured.

Further, employing an oscillator using the higher order mode as a local signal generator will accomplish a high performance transmitter-receiver module at a low cost.

Moreover, employing the oscillator of a low phase noise that uses the higher order mode as the local signal generator of a radar system will restrain the radar performance from lowering by the phase noise, whereby a high performance radar system can be made at a low cost.

DESCRIPTION OF THE PREFERRED EMBODIMENTS

According to a typical embodiment of the invention, an oscillator includes at least an active device, a microstrip line formed on a dielectric substrate, and a dielectric block disposed so as to couple with the microstrip line, in which the microstrip line and the dielectric block configure a resonator, the active device is connected to the resonator, the active device assumes a negative resistance at a desired oscillation frequency, and the dimensions of the dielectric block and so forth are set in such a manner that a resonance frequency of the lowest order mode is lower than the desired oscillation frequency, and the resonance frequency of one of the higher order modes coincides with the desired oscillation frequency, whereby the oscillator oscillates with one of the higher order modes that the resonator produces.

Here, the degree of coincidence that the one resonance frequency of the higher order modes is coincident with the desired oscillation frequency depends upon the Q factor of the resonator, and as the Q factor is high, the degree of discrepancy becomes small. Needless to say that smaller discrepancy is preferable, but there can be as large discrepancy as some MHz to some ten MHz. The setting of the degree of coincidence may be carried out in accordance with the requirements of the characteristics of the concerned system. However in any event, this invention intends to set such that the resonance frequency band of one of the higher order modes covers the desired oscillation frequency.

As a concrete mode of the invention, the active device and the resonator can take on different substrates each other, or the same substrate on which both are mounted. In general, the oscillator for the millimeter wave band employs semiconductor devices by the III-V group compound semiconductor materials. In particular, the GaAs system device is typical. Accordingly, a GaAs substrate is a typical example as the substrate for the device. The dielectric block itself can employ a general material without difficulty. A typical example is a ferroelectric Ba (Mg, Ta) $O_3$, and so forth. As the substrate for mounting the dielectric block and the microstrip line, GaAs, alumina ($Al_2O_3$), or synthetic resin, for example, Teflon can be listed. Naturally, on the same substrate can be mounted the materials of both, as already mentioned.

Further, the oscillator is provided, between the active device and the resonator, with a variable reactance device and a control terminal for supplying a control voltage to this variable reactance device, whereby the control of the oscillation frequency becomes possible by applying the control voltage to the control terminal, which is extremely useful.

The oscillator of this invention is effective for use in a microwave oscillator and a millimeter wave oscillator; for example, it is useful for a radar module, for example, a front-end module for a movable body and so forth.

Preferred embodiments of the invention will now be described.

Figure 1:
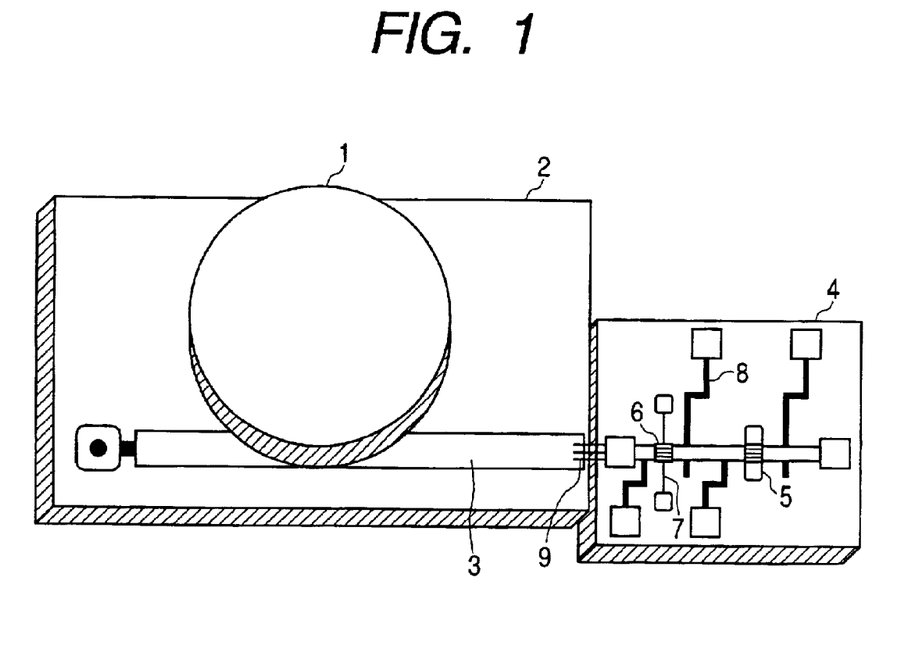
FIG. 1 is a perspective view of an embodiment using separate substrates according to the present invention.
Figure 2:
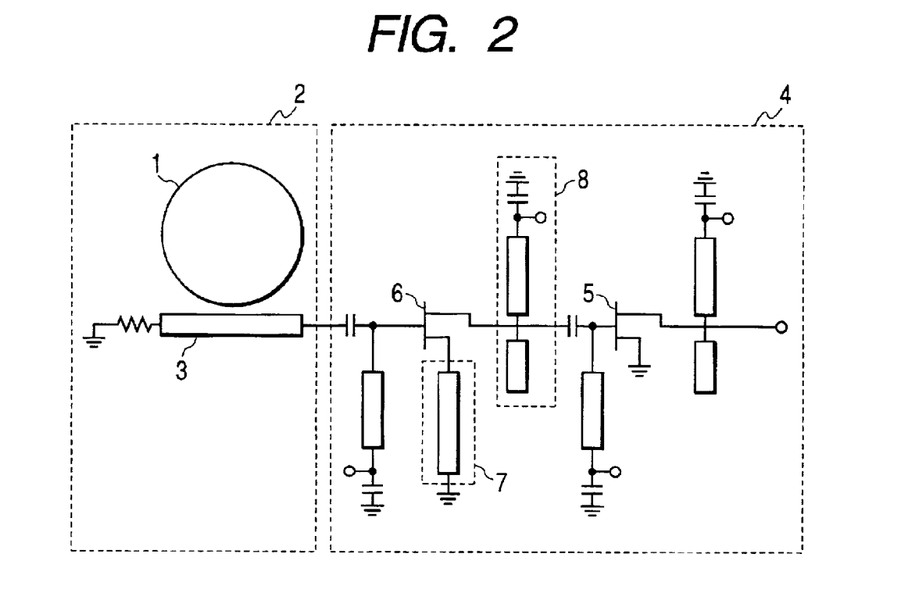
FIG. 2 is an equivalent circuit diagram of an embodiment using separate substrates according to the invention.

FIG. 1 is a perspective view of an embodiment in which a 77 GHz band oscillator is configured. FIG. 2 is an equivalent circuit diagram of this oscillator.

This embodiment shows a case in which a resonator and an active device are mounted on separate substrates of different bodies. An active device 6 that produces a negative resistance as well as an active device 5 that forms a buffer amplifier is integrated on a GaAs substrate 4 as an MMIC (Monolithic Microwave Integrated Circuit). In addition, the resonator includes a microstrip line 3 formed on an alumina substrate 2 and a cylindrical dielectric block 1 disposed on the microstrip line 3, which are coupled with each other. The MMIC is connected to, for example, the microstrip line 3 on the alumina substrate 2 through a bonding wire 9, whereby the oscillator is made up.

The dielectric block 1 uses a higher order mode of the resonator that appears near 77 GHz, of which resonance frequency of the lowest order mode TE01δ is located at about 38 GHz. In this case, the parameters of a feedback loop circuit 7 and a matching circuit 8 are adjusted so as not to generate unintentional spurious oscillations at the resonance frequencies of the lowest order mode and the unused higher order modes, in a manner that the active device 6 assumes negative resistance only within a narrow band close to the 77 GHz band.

Figure 6A:
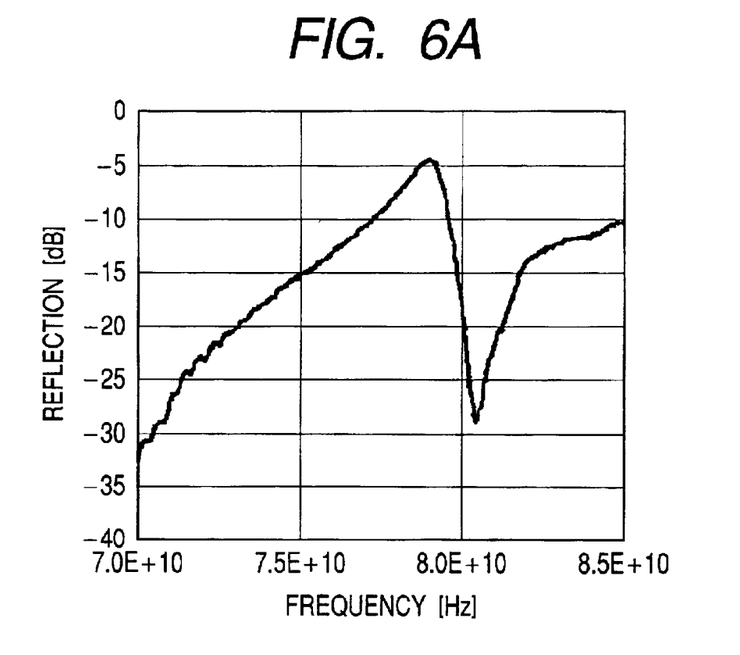
FIGS. 6A and 6B are diagrams illustrating an embodiment of a reflection property when the dielectric resonator is coupled with the microstrip line.
Figure 6B:
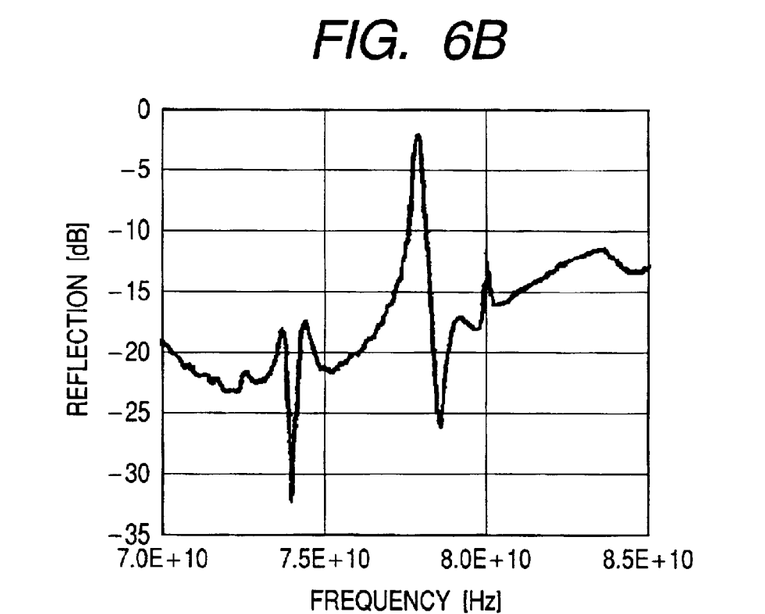

FIGS. 6A and 6B illustrate a reflection property when the dielectric block is coupled with the microstrip line formed on the GaAs substrate. The horizontal axis represents the frequency from 70 GHz to 85 GHz. The vertical axis represents the reflection by dB. FIG. 6A shows a case in which the resonator is made to resonate at the resonance frequency of the lowest order mode ($TE_{01\delta}$). On the other hand, FIG. 6B shows a case in which the resonator is made to use a higher order mode except for the lowest order mode. In this example, the resonance frequency of the lowest order mode is about 38 GHz, and the resonator is made to use the resonance frequency of the higher order mode that appears at 76 GHz. These reflection properties show that as the peak of the curve is sharper, the Q factor of the resonance is higher. Moreover, as the Q factor is higher, it becomes easier to realize a resonator of a still lower phase noise. Further, as the peak of the curve is closer to 0 dB, the coupling is stronger. In consideration of FIG. 6A and FIG. 6B, it will be understood that realizing the resonance frequency 76 GHz by the higher order mode facilitates to attain a sharper peak of the characteristic curve near this frequency and a higher Q factor.

Thus, according to this embodiment, by using a dielectric resonator that utilizes the higher order mode as a resonator for a millimeter wave band oscillator, it becomes possible to reduce the conductor loss, and to enhance the Q factor of the resonator. Therefore, it becomes possible to configure a resonator with low phase noise.

Figure 3:
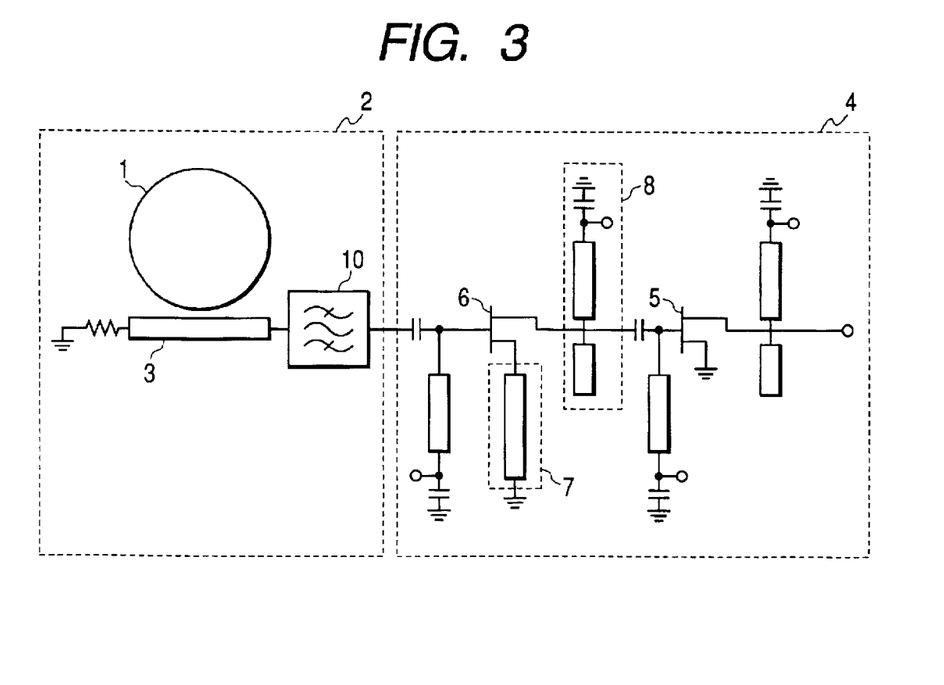
FIG. 3 is an equivalent circuit diagram of an embodiment using a filter circuit according to the invention.

Further, in this embodiment, the setting is made such that the negative resistance is produced only in a necessary band by adjusting the parameters of the feedback loop circuit 7 and the matching circuit 8; naturally, other embodiments can be adopted. FIG. 3 is an equivalent circuit diagram illustrating such an embodiment. As shown in FIG. 3, even if the active device produces the negative resistance in a comparably wide band, a filter circuit 10 inserted between the resonator and the active device restricts the band in which the negative resistance appears, which also achieves the same effect. The other components in this example are equal to those in FIG. 2.

Figure 4:
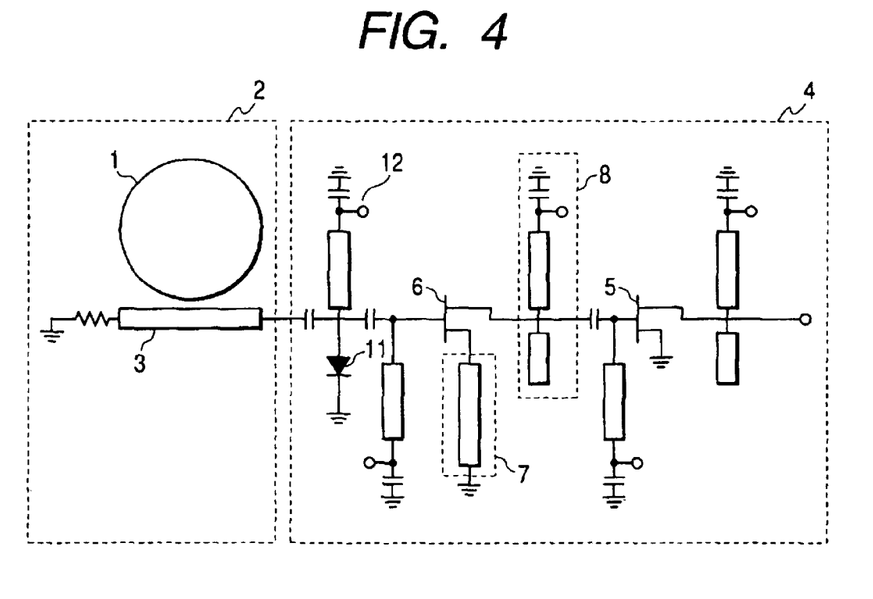
FIG. 4 is an equivalent circuit diagram of an embodiment of a voltage-controlled oscillator using a varactor diode according to the invention.

In the embodiment shown in FIG. 4, a varactor diode 11 is connected between the resonator and the active device, whereby a 77 GHz band voltage controlled oscillator is configured. The varactor diode 11 is integrated together with the other devices as the MMIC on the GaAs substrate 4; and applying a control voltage to a control terminal 12 controls the junction capacitance of the varactor diode 11. Thus, the impedance varies which is viewed from the active device toward the resonator (the impedance by the resonator and the varactor diode). This enables the control of the oscillation frequency. That is, applying a varactor diode to the resonator will make it possible to configure the voltage controlled oscillator capable of controlling the oscillation frequency by the control voltage.

Figure 7:
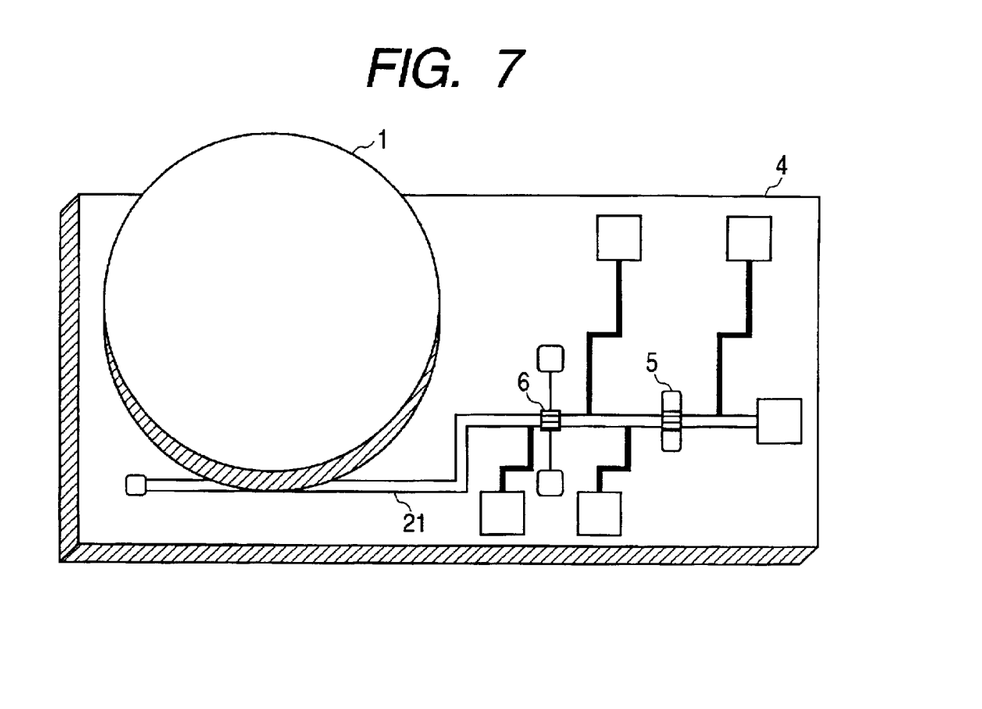
FIG. 7 is a perspective view of another embodiment of the invention that uses one substrate.

FIG. 7 illustrates an embodiment in which the MMIC is integrated on one substrate instead of using the separate substrates of the invention. The active device 6 that produces the negative resistance and the active device 5 that forms the buffer amplifier are made into an integration on the GaAs substrate 4 as the MMIC. The dielectric block 1 is disposed so as to couple with a microstrip line 21 on the MICC. The dielectric block 1 uses a higher order mode of the resonator that appears near 77 GHz, of which resonance frequency of the lowest order mode TE01δ is located at about 38 GHz. However, the thickness of the alumina substrate is virtually equal to that of the GaAs substrate, and the dielectric constant of the GaAs substrate is 12, in contrast to the dielectric constant 9.6 of the alumina substrate; and therefore, the resonance frequency of the resonator becomes slightly higher. Accordingly, the dielectric block 1 with larger dimensions can be used, in comparison to the case in which it is disposed on the alumina substrate. And, the feedback loop circuit 7 and the matching circuit 8 are adjusted so as not to generate unintentional spurious oscillations at the resonance frequencies of the lowest order mode and the unused higher order modes, in a manner that the active device 6 produces the negative resistance only within a narrow band close to the 77 GHz band. Thus, instead of using the separate substrates, forming the microstrip line and the active device on one MMIC will omit wire-bonding connection work between the resonator and the active device, which facilitates assembling work. Further, dispersions due to the assembling work will be reduced.

Figure 8:
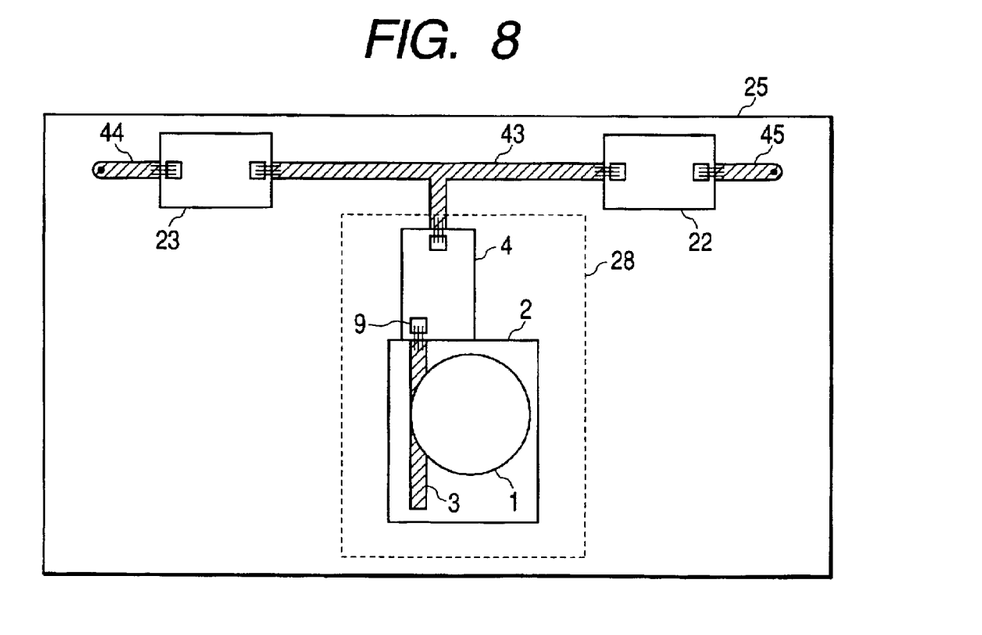
FIG. 8 is a plan view of a radar system that uses the oscillator of the invention as the local signal generator.

FIG. 8 illustrates an embodiment of a radar system, in which the oscillator using the dielectric resonator utilizing the higher order mode according to this invention is employed for a local signal generator. The figure is a plan view.

This radar system includes a local signal generator 28, a mixer 22, and a power amplifier 23, which are mounted on a mounting substrate 25. The local signal generator 28 can be implemented by means of the oscillator that has been described in the above embodiments. Basically, a dielectric block 1 and a microstrip line 3 are mounted on an alumina substrate 2. On the other hand, desired active devices are mounted on a GaAs substrate 4. In addition, both the substrates are connected to each other through the bonding wire 9. Further, this active device unit is connected through a conductor 43 to the mixer 22 and the power amplifier 23. And, these are connected through a conductor 44 and a conductor 45 to antennas.

Figure 9:
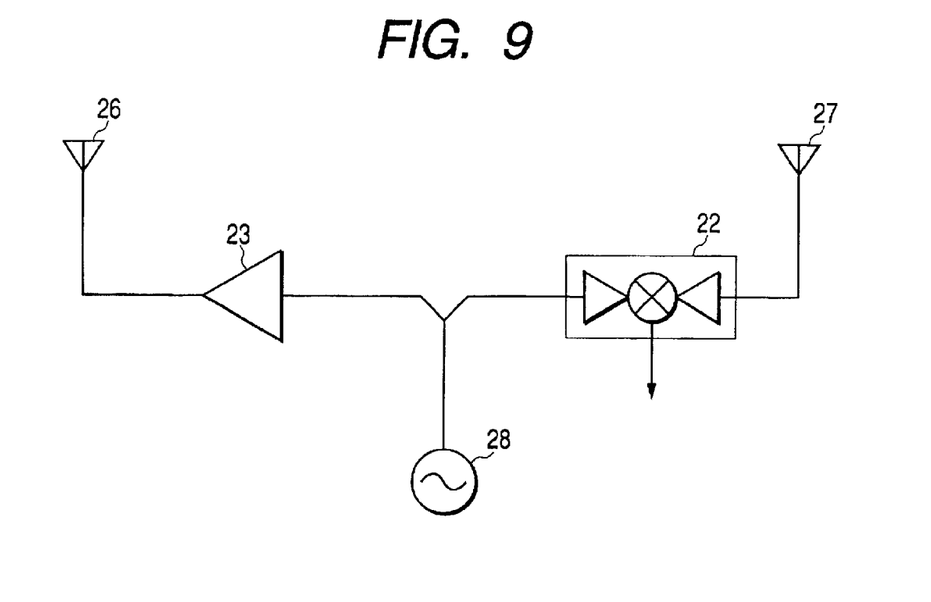
FIG. 9 is a block diagram of the radar system.

FIG. 9 represents a block diagram of such radar system. The signal generated by the local signal generator 28 is distributed to the transmitter side and the receiver side. The power amplifier 23 amplifies the signal distributed to the transmitter side, and the amplified signal is radiated from a transmitter antenna 26. This transmitted signal is reflected on a target, and if there is a relative speed between the target and the radar system, the frequency of the reflected signal will slightly vary according to the Doppler effect. A receiver antenna 27 receives this reflected signal, which is mixed with the original signal from the local signal generator 28 by the mixer 22. Thus, the low frequency signal of the Doppler frequency can be acquired. In addition, the further signal processing of this low frequency signal attains the information of the relative speed and so forth. The transmitter-receiver module using the Doppler effect, or the millimeter transmitter-receiver module itself can be configured by means of the conventional method. Naturally, configurations other than this embodiment are possible, and useless to say that this invention can be applied to such configurations.

Figure 10:
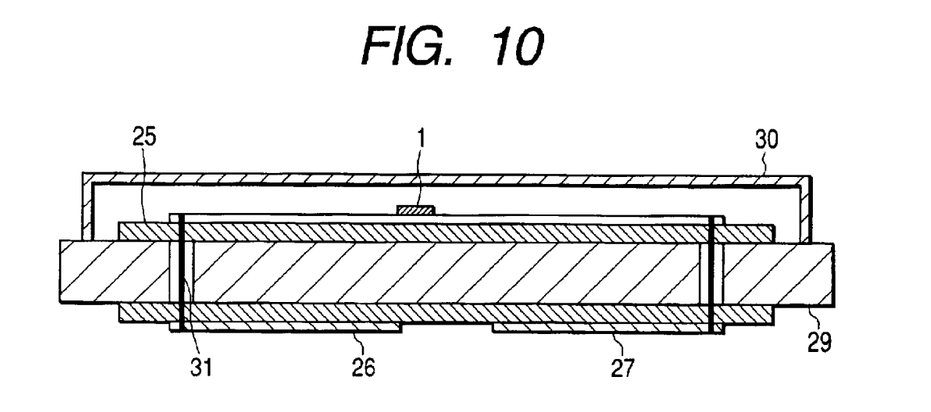
FIG. 10 is a sectional view illustrating an example of a transmitter-receiver module having the antennas on the rear side.
Figure 11:
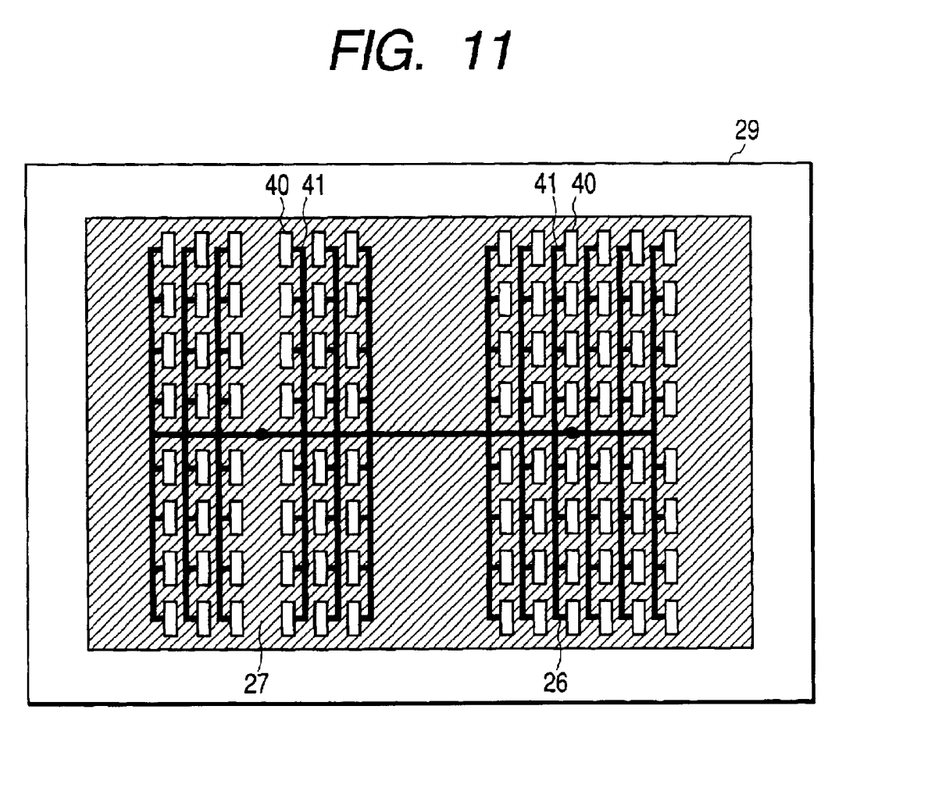
FIG. 11 is a plan view illustrating an example of a transmitter-receiver antenna.
Figure 12:
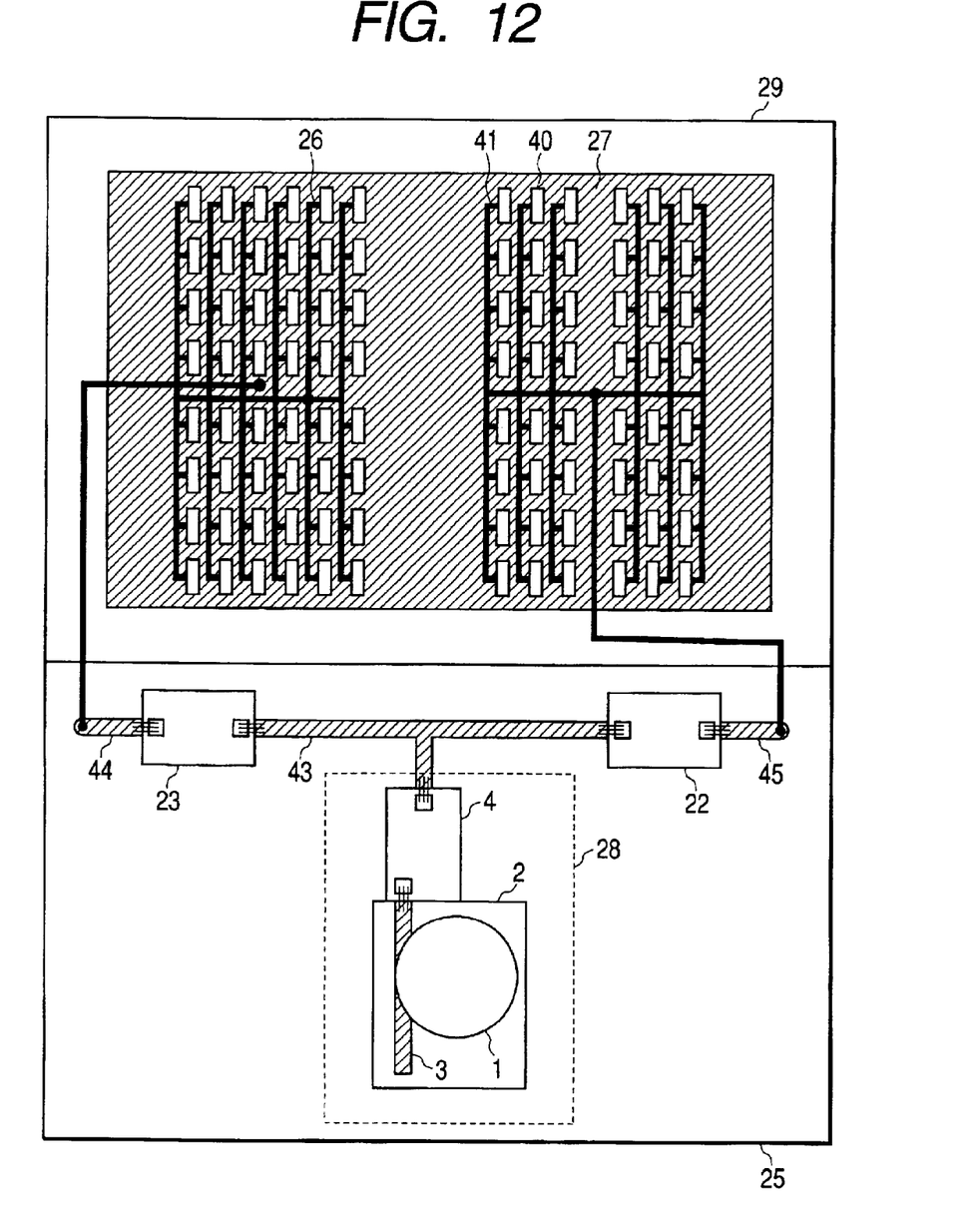
FIG. 12 is a plan view illustrating an example in which the signal generator and the antenna are disposed on a plane.

FIG. 10 through FIG. 12 illustrate examples of the mounting configuration of the signal generator part and the antennas. FIG. 10 is a sectional view of a module having the antennas on the rear side. FIG. 11 is a plan view illustrating an example of the antennas used for the module. FIG. 12 is a plan view illustrating an example in which the signal generator part and the antennas are disposed on a plane.

The module having the rear antenna mounts the mounting substrate 25 for the signal generator part on one principal plane of a base plate 29, and the transmitter antenna 26 and the receiver antenna 27 through the mounting substrate 25 on the other principal plane (this plane is called the rear side). On the mounting substrate 25 for the signal generator part is illustrated only the dielectric block 1, and other members are omitted; however, the total basic construction is the same as the one illustrated, for example, in FIG. 8. In addition, coaxial lines 31 connect the signal generator part with both the antennas 26 and 27 by way of openings piercing through the base plate 29 and the mounting substrates 25. Further, the signal generator part is provided with a cover 30, which excludes external noises. FIG. 11 illustrates an example of the antennas disposed on the rear side. The transmitter antenna 26 and the receiver antenna 27 are mounted on the mounting substrate 25 attached on the base plate 29. Symbol 40 denotes antenna elements, and symbol 41 denotes conductor parts that connect the antenna elements to form an integrated antenna. Practically, both of them are formed by means of patterning in general.

FIG. 12 illustrates an example in which the signal generator part and the antennas are disposed on a plane. The detailed construction of the parts is the same as the example illustrated in FIG. 10 and FIG. 11. The base plate 29 and the mounting substrate 25 are placed on one plane, both of which are connected to each other according to a specific electrical configuration.

As in this embodiment, employing the oscillator using a dielectric resonator utilizing a higher order mode as the local signal generator for the radar system will restrain the radar performance from lowering caused by a phase noise, and achieve a high-performance radar system at a low cost.

As the invention has been described on the basis of the embodiments, according to the invention, since a higher order mode is utilized for the resonance frequency of a dielectric resonator, it becomes possible to expand the dimensions of a dielectric block, and to thereby reduce a conductor loss. Accordingly, the Q factor of the resonator can be heightened, and by using this resonator, the oscillator of a low phase noise can be realized at a low cost.

Further, the expansion of the dimensions of a dielectric block leads to reduction in the production cost of the dielectric block and the assembling cost of the oscillator.

Further, employment of this oscillator as the local signal generator of a radar system will realize a high-performance radar system at a low cost.

According to the present invention, an oscillator with a low phase nose in which the Q factor of a dielectric resonator is high can be provided.

According to the present invention, an oscillator with a low phase nose in which the Q factor of a dielectric resonator is high can be provided at a low cost.

According to the present invention, a radar system can be provided at a low cost.

Primary reference numerals are shown as in the following:

1; dielectric block 2; alumina substrate 3; microstrip line 4; GaAs substrate 5; active device forming an amplifier 6; active device producing a negative resistance 7; feedback loop circuit 8; matching circuit and bias circuit 9; bonding wire 10; filter circuit 11; varactor diode 12; control terminal 13; dielectric block 15; active device producing a negative resistance 16; microstrip line 17; feedback loop circuit 18; matching circuit and bias circuit 21; microstrip line 22; mixer 23; power amplifier 25; mounting substrate 26; transmitter antenna 27; receiver antenna 28; local signal generator 29; base plate 30; cover 31; coaxial line 40; antenna part 41; conductor constituting an integral antenna 43; microstrip line 44; conductor for supplying power to an transmitter antenna 45; conductor for a receiver antenna

What is claimed is:

1. An oscillator comprising:
   an active device;
   a substrate;
   a microstrip line formed on the substrate; and
   a cylindrical dielectric block disposed to couple with the microstrip line in a manner that a base surface of the cylindrical dielectric block is substantially parallel to a surface of the substrate on which the microstrip line is formed,
   wherein the microstrip line and the cylindrical dielectric block form a resonator, the active device and the resonator are electrically connected with each other, the active device produces a negative resistance in a desired oscillation frequency band, and a resonance frequency of a lowest order mode of the cylindrical dielectric block is lower than a desired oscillation frequency and a resonance frequency band of one of the higher order modes covers the desired oscillation frequency, and
   wherein the cylindrical dielectric block is to resonate in at least one of the higher order modes.

2. The oscillator according to claim 1, wherein the substrate is a dielectric substrate.

3. The oscillator according to claim 1, wherein the active device, the microstrip line, and the cylindrical dielectric block are mounted on the common substrate.

4. The oscillator according to claim 2, wherein the active device, the microstrip line, and the cylindrical dielectric block are mounted on the common substrate.

5. The oscillator according to claim 1, wherein the active device is mounted on another substrate different from the substrate.

6. The oscillator according to claim 2, wherein the active device is mounted on another substrate different from the substrate.

7. An oscillator comprising:
   an active device;
   a substrate;
   a microstrip line formed on the substrate; and
   a cylindrical dielectric block disposed to couple with the microstrip line,
   wherein the microstrip line and the dielectric block form a resonator, the active device and the resonator are electrically connected with each other, the active device produces a negative resistance in a desired oscillation frequency band, and a resonance frequency of a lowest order mode of the dielectric block is lower than a desired oscillation frequency and a resonance frequency band of one of the higher order modes covers the desired oscillation frequency, and
   wherein the oscillator includes a variable reactance device between the active device and the resonator, and a control of an oscillation frequency is possible by a characteristic control of the variable reactance device 8. The oscillator according to claim 7, wherein the substrate is a dielectric substrate.

9. The oscillator according to claim 7, wherein the active device, the microstrip line, and the dielectric block are mounted on the common substrate.

10. The oscillator according to claim 8, wherein the active device, the microstrip line, and the dielectric block are mounted on the common substrate.

11. The oscillator according to claim 7, wherein the active device is mounted on another substrate different from the substrate.

12. The oscillator according to claim 8, wherein the active device is mounted on another substrate different from the substrate.

13. A transmitter-receiver module comprising:
a local signal generator; and
an antenna unit connected electrically to the local signal generator,
wherein the local signal generator includes an oscillator, and the oscillator comprises:
an active device;
a substrate;
a microstrip line formed on the substrate; and
a cylindrical dielectric block disposed to couple with the microstrip line in a manner that a base surface of the cylindrical dielectric block is substantially parallel to a surface of the substrate on which the microstrip line is formed,
wherein the microstrip line and the cylindrical dielectric block form a resonator, the active device and the resonator are electrically connected with each other, the active device produces a negative resistance in a desired oscillation frequency band, and a resonance frequency of the lowest order mode of the cylindrical dielectric block is lower than the desired oscillation frequency and a resonance frequency band of one of the higher order modes covers the desired oscillation frequency, and
wherein the cylindrical dielectric block is to resonate in at least one of the higher order modes.

14. The transmitter-receiver module according to claim 13, wherein the substrate is a dielectric substrate.

15. The transmitter-receiver module according to claim 13, wherein the active device, microstrip line, and cylindrical dielectric block are mounted on the common substrate.

16. The transmitter-receiver module according to claim 13, wherein the active device is mounted on another substrate different from the substrate.

17. A radar system comprising:
a local signal generator;
a transmitter antenna connected electrically to the local signal generator;
a mixer connected electrically to the local signal generator; and
a receiver antenna connected electrically to the mixer;
wherein the local signal generator includes an oscillator, and the oscillator comprises:
an active device;
a substrate;
a microstrip line formed on the substrate; and
a cylindrical dielectric block disposed to couple with the microstrip line in a manner that a base surface of the cylindrical dielectric block is substantially parallel to a surface of the substrate on which the microstrip line is formed,
wherein the microstrip line and the cylindrical dielectric block form a resonator, the active device and the resonator are electrically connected with each other, the active device produces a negative resistance in a desired oscillation frequency band, and a resonance frequency of the lowest order mode of the cylindrical dielectric block is lower than the desired oscillation frequency and a resonance frequency band of one of the higher order modes covers the desired oscillation frequency,
wherein the transmitter antenna radiates a signal generated by the local signal generator as a transmission signal, the receiver antenna receives a reflection signal that the transmission signal is reflected on a target, and the mixer mixes the reflection signal and the signal generated by the local signal generator, and
wherein the cylindrical dielectric block is to resonate in at least one of the higher order modes.

18. The radar system according to claim 17,
wherein the substrate is a dielectric substrate.

19. The radar system according to claim 17,
wherein the active device, the microstrip line, and the cylindrical dielectric block are mounted on the common substrate.

20. The radar system according to claim 17,
wherein the active device is mounted on another substrate different from the substrate.

* * * * *